United States Patent
Pilolli et al.

(10) Patent No.: US 11,282,550 B2
(45) Date of Patent: Mar. 22, 2022

(54) TECHNIQUES TO CALIBRATE AN IMPEDANCE LEVEL

(71) Applicant: Intel Corporation, Santa Clara, CA (US)

(72) Inventors: Luigi Pilolli, L'Aquila (IT); Agatino Massimo Maccarrone, Regalbuto (IT); Jiawei Chen, Shanghai (CN); Qiang Tang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/253,573

(22) PCT Filed: Oct. 12, 2018

(86) PCT No.: PCT/CN2018/109957
§ 371 (c)(1),
(2) Date: Dec. 17, 2020

(87) PCT Pub. No.: WO2020/073300
PCT Pub. Date: Apr. 16, 2020

(65) Prior Publication Data
US 2021/0134334 A1    May 6, 2021

(51) Int. Cl.
*G11C 7/10*        (2006.01)
*G11C 5/14*        (2006.01)
*G11C 29/02*       (2006.01)

(52) U.S. Cl.
CPC ............ *G11C 7/1051* (2013.01); *G11C 5/147* (2013.01); *G11C 29/022* (2013.01)

(58) Field of Classification Search
CPC . G11C 7/1051; G11C 5/147; G11C 29/50008; G11C 29/028; G11C 29/022
See application file for complete search history.

(56) References Cited

U.S. PATENT DOCUMENTS 6,268,750 B1 *  7/2001  Esch, Jr. ............... H03H 11/28
                                            326/27
7,773,440 B2    8/2010  Kim et al.
(Continued)

FOREIGN PATENT DOCUMENTS

CN    104681055 A    6/2015
CN    104135268 A    4/2017
(Continued)

OTHER PUBLICATIONS

Intel Corporation, Micron Technology, Inc. et al., "Open NAND Flash Interface Specification" Revision 4.0, Apr. 2, 2014, 315 pages.
(Continued)

*Primary Examiner* — Sultana Begum
(74) *Attorney, Agent, or Firm* — Compass IP Law PC

(57) ABSTRACT

Examples described herein can be used to calibrate resistances provided by pull-up and pull-down circuits in an output driver circuit. A first reference voltage can be determined and applied to set a resistance level of a pull-up circuit to a desired level. A code for activating one or more transistor in the pull-up circuit can be determined against the first reference voltage. For a pull-down circuit, a second reference voltage can be set a resistance level of the pull-down circuit to a desired level. The resistance level of the pull-down circuit can be set to equal to the resistance level of the pull-up circuit. A second code can be set for activating one or more transistor in the pull-down circuit. The first and second reference voltages can be represented by index values. The code and second code can be stored for use by the pull-up circuit and pull-down circuit. Re-calibration of the pull-up and pull-down circuits can be performed to determine codes using the first and second reference voltages.

21 Claims, 7 Drawing Sheets

(56) References Cited

U.S. PATENT DOCUMENTS 9,563,213 B2 2/2017 Addepalli et al.
2008/0100333 A1 5/2008 Kim et al.

FOREIGN PATENT DOCUMENTS

| CN | 107919148 A | | 4/2018 |
|----|-------------|---|--------|
| CN | 108511013 A | | 9/2018 |
| CN | 110793541 A | * | 2/2020 |
| WO | 2020073300 A1 | | 4/2020 |

OTHER PUBLICATIONS

International Search Report and Written Opinion for PCT Patent Application No. PCT/CN18/109957, dated Jul. 10, 2019, 9 pages.
Micron, "Technical Note DDR3 ZQ Calibration Introduction", TN-41-02, 2008 Micron Technology, Inc., 5 pages.
Micron, "Technical Note ONFI 4.0 Design Guide Introduction", TN-29-83, 2015 Micron Technology, Inc., 11 pages.

* cited by examiner

TECHNIQUES TO CALIBRATE AN IMPEDANCE LEVEL

CLAIM OF PRIORITY

This application is a U.S. National Phase application under 35 U.S.C. § 371 of International Application No. PCT/CN18/109957 filed Oct. 12, 2018, entitled "TECHNIQUES TO CALIBRATE AN IMPEDANCE LEVEL" the entire contents of which are incorporated herein by reference.

TECHNICAL FIELD

Various examples are described herein that relate to techniques to calibrate impedance of a circuit.

BACKGROUND

A variety of computing devices include input and output connectors (e.g., pads or pins) that respectively receive and transfer signals (e.g., electrical signals) from or to one or more other devices. For example, memory, storage, processors, and sensors are devices that include input and output connectors. An output connector typically has an output driver with a characteristic resistance ($R_{on}$) that is experienced by any device that is coupled to the output connector. The resistance and impedance of the output driver can vary from what is expected due to semiconductor process variations that yield impedance that is different than specification or change due to various circumstances such as changes in power supply voltage, changes in operating temperature, or other factors. An impedance mismatch can arise between an input circuit that is coupled to the output driver from a mismatch between an impedance of the input circuit and the impedance of the output circuit. The impedance mismatch can cause signal reflection at the connection of the input circuit and the output driver. Signal reflection can compromise signal integrity of signals transferred between the input circuit and the output driver. As the operating speed of devices increases, the voltage swing has reduced to reduce supply current and minimize transmission delay. However, the reduction in swing provides more exposure of the signals to external noise. Signal reflection can further degrade the integrity of signals provided by the output driver.

To alleviate impedance mismatch, the output driver may be calibrated. One calibration technique is referred as ZQ calibration. For example, Open NAND Flash Interface Specification (ONFI) revision 4.0 (April 2014) specifies an optional ZQ Calibration that is used to calibrate NAND Output driver impedance RON and ODT values.

DETAILED DESCRIPTION

Figure 1:
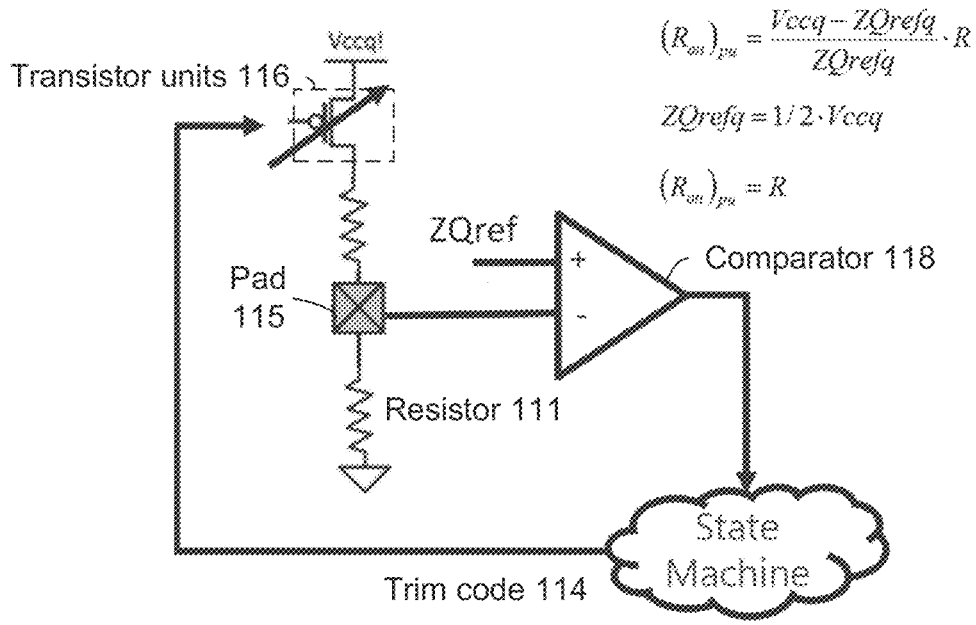
FIG. 1 illustrates an example of pull-up calibration and pull-down calibration.
Figure 1:
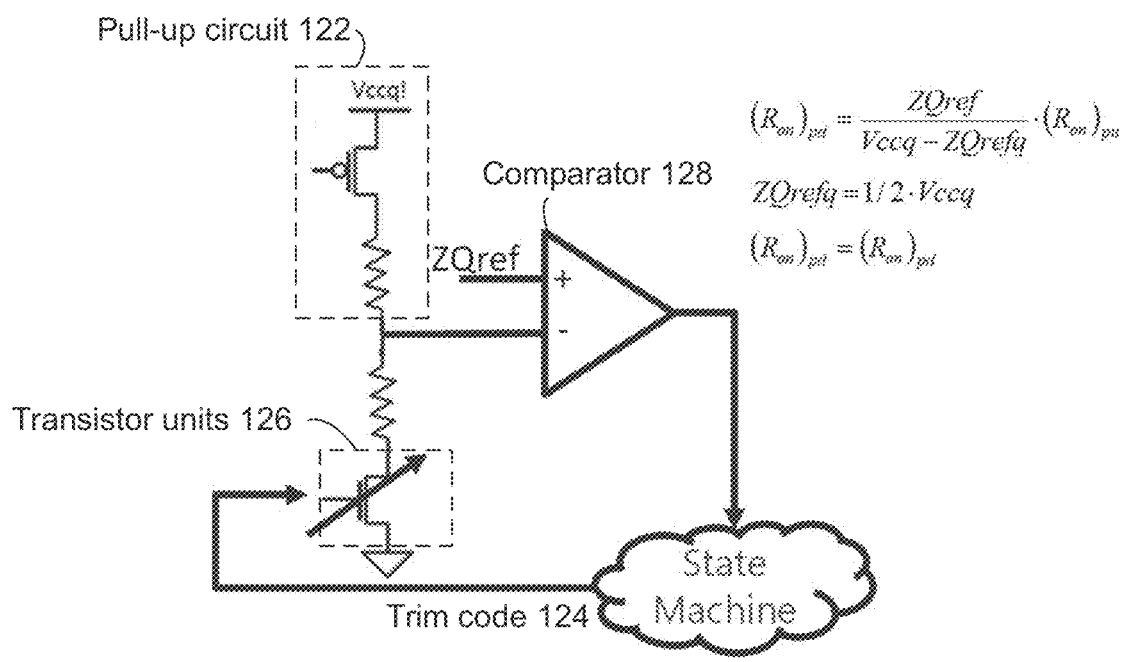

In some examples, during calibration of an output driver, an internal resistor is used for calibration against an external bias current. An advantage of using an internal resistor is there no need for a dedicated pin for coupling to an off-chip ZQ calibration resistor. This permits a faster ZQ calibration because there is no capacitance associated with the external pin. However, additional hardware (including both analog circuitries and logic state machine) may be needed to support use of the internal resistor. A resistance level of an internal resistor can vary from what is expected or specified. The resistance of an internal resistor can vary used in one fabricated output driver and another fabricated output driver at least because of semiconductor manufacturing process variations. Currently, fabrication processes for NAND memory and dynamic random access memory (DRAM) do not fabricate resistance with sufficiently accurate resistance.

Some embodiments provide a manner of adjusting or trimming a resistance of an internal resistor used for ZQ calibration without using switches in the calibration path. Instead of adding switches in the low resistance high-speed calibration path, which can negatively affect ZQ calibration resolution and complexity, adjusting or trimming can be performed done through managing or mapping the internal resistance variation to potentially different reference voltage levels for separate calibration of pull-up and pull-down circuits. A reference voltage level for a pull-up circuit can be set in order to achieve a desired output resistance from the pull-up circuit using a first calibration code. A comparator can be used to compare voltage output from the pull-up circuit in combination with the internal resistor against the tuned reference voltage level. A first code can be determined to adjust impedance or resistance of the pull-up circuit so that the voltages compared by the comparator are approximately the same. The pull-up circuit can be configured to be operational using its first digital code while connected to the pull-down circuit during calibration of the pull-down circuit. A second reference voltage can be selected so that an output resistance of the pull-down circuit matches the output resistance of the pull-up circuit using a second calibration code. The comparator can be used to compare a voltage provided by a combination of the pull-up circuit can be configured to be operational using its first digital code with the pull-down circuit against the second reference voltage. A second digital code (which can be the same or different than the first digital code) can be determined to adjust impedance or resistance of the pull-down circuit so that the voltages compared by the comparator are approximately the same. Two calibration codes can be used to select two different voltage reference values during the pull-up and pull-down calibration process to manage any eventual internal resistance variability by use of a digital multiplexer and a control signal (and associated circuitry), thereby providing a small additional hardware cost, if any. Accordingly, calibration of pull-up and pull-down circuits used in an output driver can occur despite an impedance or resistance of an internal resistor differing from an expected value.

FIG. 1 provides a known technique for output driver calibration using a resistor. During pull-up calibration 110, resistor 111 is used to calibrate the impedance provided by one or more transistor units 116 and a state machine selects a digital code 114 to activate one or more transistors to cause comparator 118 to indicate the difference between the reference voltage ZQref and the voltage from pad 115 is zero. During pull down calibration 120, pull-up circuit 122 uses the code 114 determined by pull-up calibration 110 and the pull-up circuit 122 is connected to one or more transistor units 126. A state machine determines code 124 to activate one or more of transistor units 126 so that comparator 128 determines a voltage received at its negative (−) terminal to be the same as that of the reference voltage ZQref Thereafter, the codes 114 and 124 are used when the pull-up and pull-down circuits are used in the output driver of a device.

For both pull-up and pull-down calibration, the accuracy of the resistance of resistor 111 impacts how effective the calibration will be. Typically, resistor 111 is a high precision calibration resistor that is located off of the semiconductor chip from the device that includes the output driver and pull-up circuits and pull-down circuits. The high precision resistor can provide a desired resistance that can be used to calibrate the driver against a known resistance level. However, an external resistor is typically expensive, relatively speaking, and adds system overhead in terms of additional needed hardware logic.

In some cases, resistor 111 can be internal to the semiconductor package or device that also includes the output driver that is to have its impedance or resistance calibrated. However, the accuracy of the internal resistor is much less than that of the external resistor and the corresponding calibration may be ineffective because calibration is applied against a different resistance than expected.

Another technique for ZQ calibration using an internal resistor provides for an ability to adjust the effective resistance provided the internal resistor by providing and using a tunable resistance trimming unit. However, the additional hardware provided by the tunable resistance trimming unit increases the amount of hardware needed by the device and can make the device larger and more expensive to manufacture.

Figure 2:
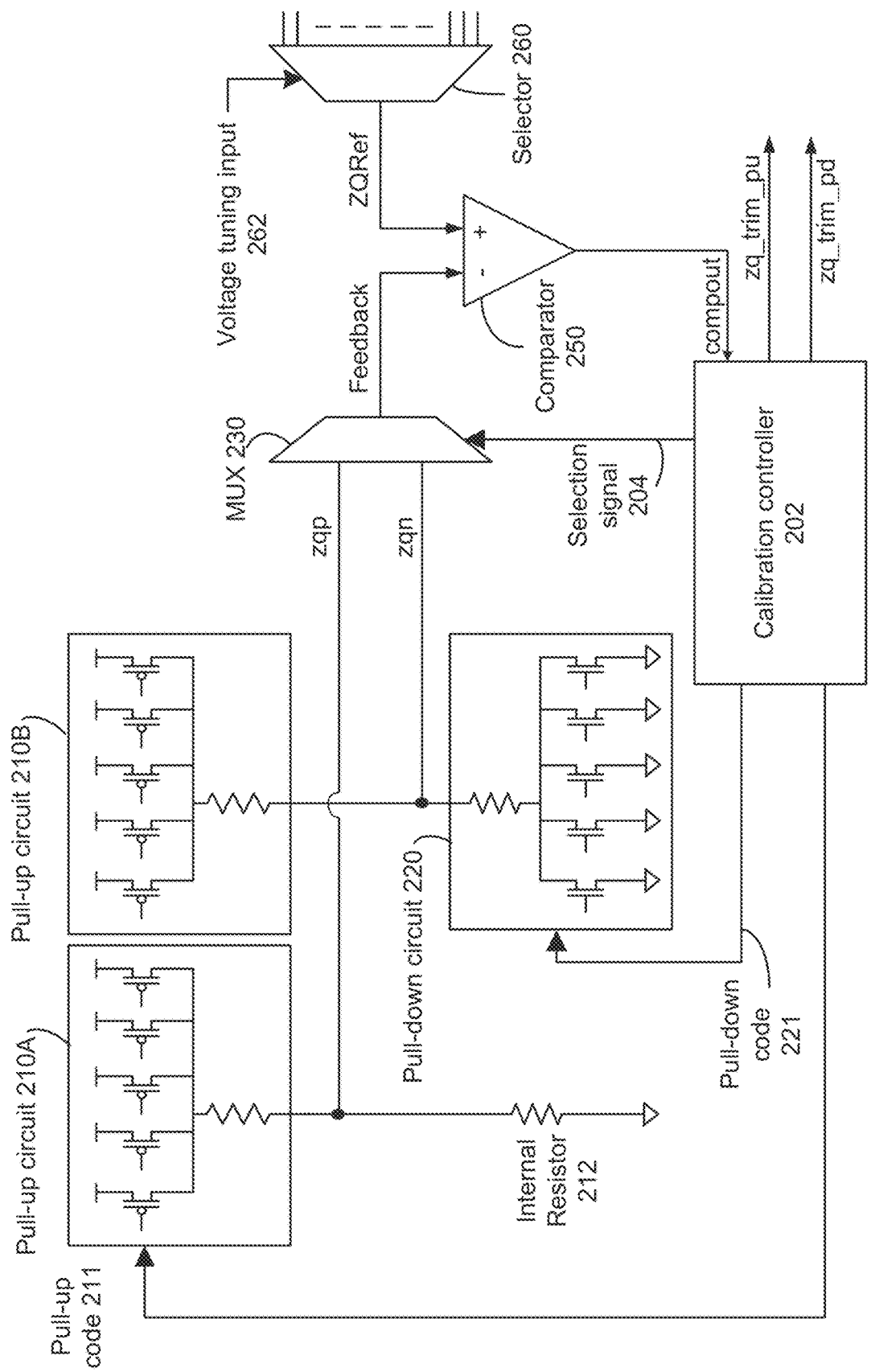
FIG. 2 depicts an example system for calibration of pull-up and pull-down circuits.

FIG. 2 depicts an example system for calibration of pull-up and pull-down circuits. Calibration controller 202 provides for calibration of pull-up circuit 210A and pull-down circuit 220 by use of internal resistor 212, multiplexer (MUX) 230, comparator 250, and selector 260. Calibration controller 202 can set selection signal 204 to select calibration of pull-up circuit 210A or calibration of pull-down circuit 220. Internal resistor 212 can be a manufactured semiconductor device and can be internal to a packaging that houses another semiconductor device or devices (e.g., one or more memory devices and/or an output driver of a memory device) and internal resistor 212 can be coupled with the other semiconductor device or devices. Internal resistor 212 can be manufactured with the semiconductor device as part of the same manufacturing process and part of the same substrate or die. For example, if the semiconductor device is a memory device, internal resistor 212 can be manufactured as part of the memory device or can be communicatively coupled to the memory device but separate from the memory device. An internal resistor 212 can be chosen from among manufactured resistors as one that exhibits a relatively stable resistance despite voltage and temperature changes.

Internal resistor 212 can be formed from one or more transistor units. A transistor unit can be any type of transistor device, including but not limited to one or more of: a metal-oxide-semiconductor field-effect transistor (MOSFET), n-channel MOSFET (NMOS), p-channel MOSFET (PMOS), field effect transistor (FET), junction gate field-effect transistor (JFET), or bipolar junction transistor (BJT).

A variety of measurement techniques can be used to measure the resistance of internal resistor 212 such as connecting a series of N internal resistors together, providing a current through the resistors, determining an average resistance provided by the N resistors, and attributing the average resistance to internal resistor 212. Measurement can take place in a factory that manufactures a memory device or resistor or both.

The measured resistance of internal resistor 212 can be used to calibrate pull-up circuit 210A or pull-down circuit 220 and to set the reference voltage $ZQ_{ref}$ during the calibration of pull-up circuit 210A or pull-down circuit 220.

For example, if an expected or desired resistance of pull-up circuit 210A is 300Ω but the measured resistance of internal resistor 212 is 290Ω, then reference voltage $ZQ_{ref}$ can be set using a calibration value K so that desired resistance seen at the output of the pull up driver, $(R_{on})_{pu}$, is 300Ω. The pull-up driver output resistance can be expressed as:

$$(R_{on})_{pu} = \frac{Vccq - ZQrefq}{ZQrefq} \cdot R$$

where:
R is the internal resistance level of resistor 212,
$V_{ccq}$ is the reference voltage level,
$ZQrefq = K_1 \cdot Vccq$ and
$K_1$ is an adjustable calibration value based on $V_{ccq}$ and can be set by voltage tuning input 262 to selector 260. Accordingly, the pull-up driver output resistance can be expressed as:

$$(R_{on})_{pu} = \frac{1 - K_1}{K_1} \cdot R$$

In the example above, where $(R_{on})_{pu}$ is 300Ω and the resistance of resistor 212 is 290Ω, then $K_1$ is 0.492 and the voltage provided by selector 260 is $0.492*V_{ccq}$. Accordingly, voltage tuning input 262 can be selected to provide an output from selector 260 of $0.492*V_{ccq}$. In some examples, test equipment, for example at a factory used to manufacture or test a memory device, can be used to determine a voltage tuning input 262 to provide the desired reference voltage. In some examples, controller 202 may determine a voltage tuning input 262 to provide the desired reference voltage.

For a calibration of pull-up circuit 210A, calibration controller 202 can set selection signal 204 to select calibration of pull-up circuit 210A. After resistance of internal resistor 212 is determined, voltage tuning input 262 can be selected so that the reference voltage provided as $ZQ_{ref}$ produces a target pull-up output resistance. Comparator 250 compares an input of $ZQ_{ref}$ (in the example above, $0.492*V_{ccq}$) with an input at terminal zqp from pull-up circuit 210A. Calibration controller 202 can set selection signal 204 so that an output from pull-up circuit 210A (shown as signal zqp) is transferred by multiplexer 230 as feedback to comparator 250. Calibration controller 202 can adjust code 211 so that a difference between $ZQ_{ref}$ and zqp is zero (or near zero) and the signal compout is zero or near zero. The selected code 211 can be used during calibration of pull-down circuit 220 and operation.

Code 211 can be used to select a number of transistors in pull-up circuit 210A that are activate or inactive. The number of active transistors corresponds to an effective impedance contribution by pull-up circuit 210A. For example, a code of 00000 provides for no active transistors in pull-up circuit 210A and no contributed impedance or resistance. A code of 11111 provides for all transistors in pull-up circuit 210A to be active and corresponding contributed impedance or resistance. A code of 00001 provides for a transistor in pull-up circuit 210A to be active and corresponding contributed impedance or resistance. The code can indicate which transistor in a chain is to be active or a number of transistors to be active. The code can be transmitted in parallel or serially. Transistors can be different sizes or the same size and accordingly contribute different or the same impedance if activated. A transistor can be implemented as any type of transistor device, including but not limited to one or more of: a metal-oxide-semiconductor field-effect transistor (MOSFET), n-channel MOSFET (NMOS), p-channel MOSFET (PMOS), field effect transistor (FET), junction gate field-effect transistor (FET), or bipolar junction transistor (BJT). Note that pull-up circuit 210A as depicted is a mere example and any type of device can be used that provides an output resistance or impedance that is tunable based on code 211.

For calibration of pull-down circuit 220, calibration controller 202 can set selection signal 204 provided to multiplexer 230 to transfer the output from pull-down circuit 220 (shown as signal zqn) to comparator 250. For calibration of pull-down circuit 220, calibration controller 202 can use pull-up circuit 210B with transistors of pull-up circuit 210B enabled based on pull-up code 211 determined from calibration of pull-up circuit 210A (not shown). Although not depicted, pull-up circuit 210A can be coupled to pull-down circuit 220 instead of using pull-up circuit 210B at least for calibration of pull-down circuit 220.

An effective output resistance of pull-down circuit 220 can be represented as:

$$(R_{on})_{pd} = \frac{ZQref}{Vccq - ZQrefq} \cdot (R_{on})_{pu}$$

In some examples, the output resistance of pull-down circuit 220, $(R_{on})_p a$, is set to the same output resistance of pull-up circuit 210A such that $(R_{on})_{pd}=(R_{on})_{pd}$ and ZQrefq=½·Vccq. Voltage tuning input 262 can be set so that reference voltage $ZQ_{ref}$ is $V_{ccq}/2$. However, the output resistance of pull-down circuit 220, $(R_{on})_{pd}$ can be set to any desired value.

Calibration controller 202 can set tuning input 262 to a value such that $ZQ_{ref}$ is $V_{ccq}/2$. Calibration controller 202 controls selection signal 204 so that a signal from pull-down circuit 220 (terminal zqn) is transferred by multiplexer 230 to comparator 250. Comparator 250 compares an input of $ZQ_{ref}$ (in an example, set to $V_{ccq}/2$) with an input at terminal zqn from pull-down circuit 220. Calibration controller 202 can adjust pull-down code 221 to achieve a zero (or near zero) feedback output (compout) from comparator 250. Code 221 can be used to select a number of transistors in pull-down circuit 220 that are activate. The number of active transistors corresponds to an effective impedance contribution by pull-down circuit 220. The code can indicate which transistor in a chain is to be active or a number of transistors to be active. The code can be transmitted in parallel or serially. Transistors can be different sizes or the same size and accordingly contribute the same or different impedances if activated. A transistor can be implemented as any type of transistor device, including but not limited to one or more of: a metal-oxide-semiconductor field-effect transistor (MOS-FET), n-channel MOSFET (NMOS), p-channel MOSFET (PMOS), field effect transistor (FET), junction gate field-effect transistor (FET), or bipolar junction transistor (BJT). Note that pull-down circuit 220 as depicted is a mere example and any type of device can be used that provides an output resistance or impedance that is tunable based on code 221. Pull-down code 221 can be determined from calibration of pull-down circuit 220 and during subsequent operation and use of pull-down code 221.

As an output or result of calibration, controller 202 can output the pull-up code 211 and pull-down code 221 as respective zq_trim_pu and zq_trim_pd. Pull-up code 211 and pull-down code 221 can be stored in memory or storage for use during operation of the memory. During operation of an output circuit driver, zq_trim_pu and zq_trim_pd can be used to control a number or specific transistors that are to be active or an impedance or resistance level provided by respective pull-up and pull-down circuits. These codes can be used to configure the DQ input/output pins for a device during operation. For example, DQ input/output pins can be part of a NAND memory device and can be used to provide data or other information or commands or receive data or other information or commands.

Figure 3:
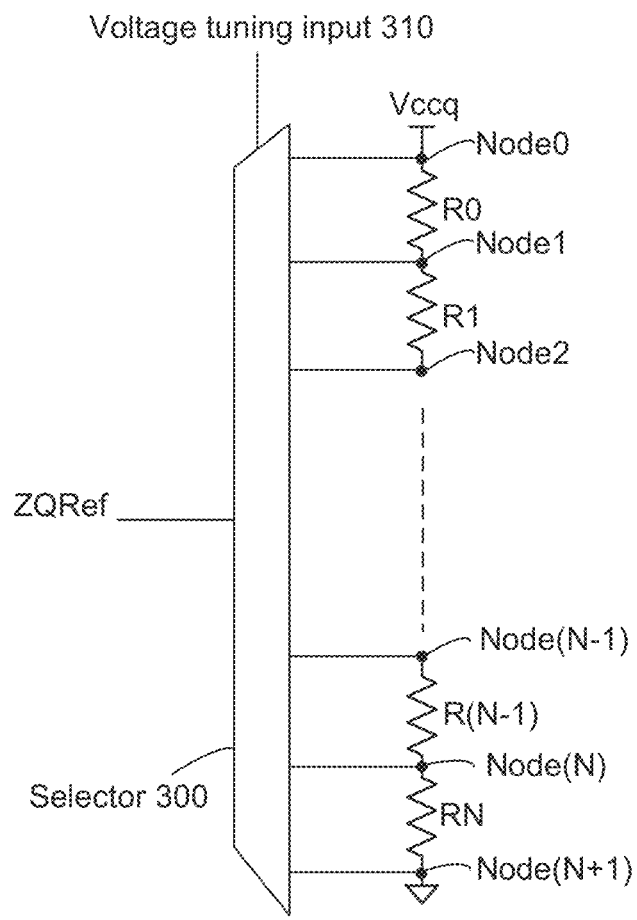
FIG. 3 depicts an example circuit that can be used to provide a reference voltage.

FIG. 3 depicts an example circuit that can be used to provide a reference voltage. In this example, $V_{ccq}$ is a bias voltage and is coupled to a resistor ladder having resistors R0 to RN coupled in series with nodes Node0 to NodeN. Each of nodes Node0 to NodeN provides an input to selector 300. In one example, each resistor R0 to RN can have the same or approximately the same resistance value. Node0 would provide a voltage of $V_{ccq}$ to selector 300 and node (N+1) would provide a voltage of zero. Any of nodes Node1 to NodeN can provide some fraction of $V_{ccq}$ as an input to selector 300. Voltage tuning input 310 can select which voltage from nodes Node0 to Node(N+1) to output, for example, to a voltage comparator. Voltage tuning input 310 can select the voltage and node based on the determined voltage calibration value (e.g., $K_1$). For example, to provide a bias voltage of $V_{ccq}/2$, where N=6, an output from Node4 can be output by selector 300. For example, if the desired reference voltage is not available, a nearest reference voltage can be selected by choosing a $K_1$ value.

Figure 4:
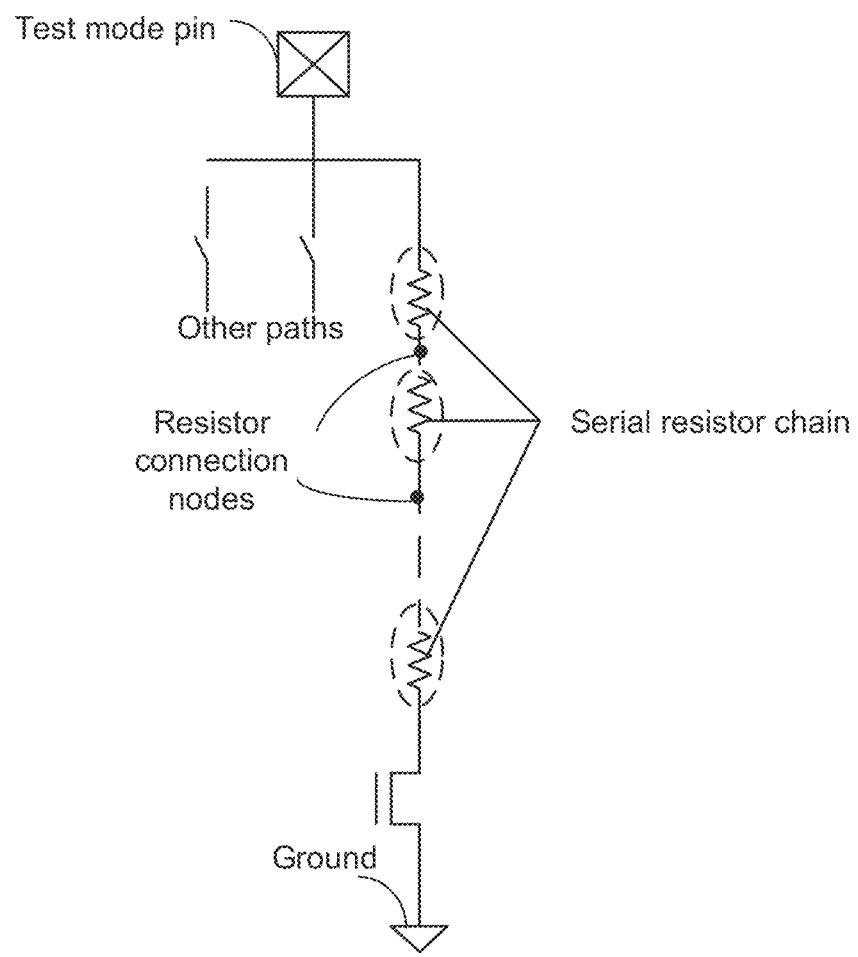
FIG. 4 depicts an example manner to determine a resistance of a resistor.

FIG. 4 depicts an example manner to determine a resistance of an internal resistor. For example, the resistance can be determined for an internal resistor that is in the same die or package as that of the output circuit that is to have its output driver impedance calibrated. A serial chain of resistors can be connected to a test mode pin and a bias voltage or set current applied to the test mode pin to provide current to the chain of resistors. Ground can be enabled, voltage can be measured at each node that connects two resistors together, and the average resistance can be determined by voltage drops across the resistors for the known current supply.

Figure 5:
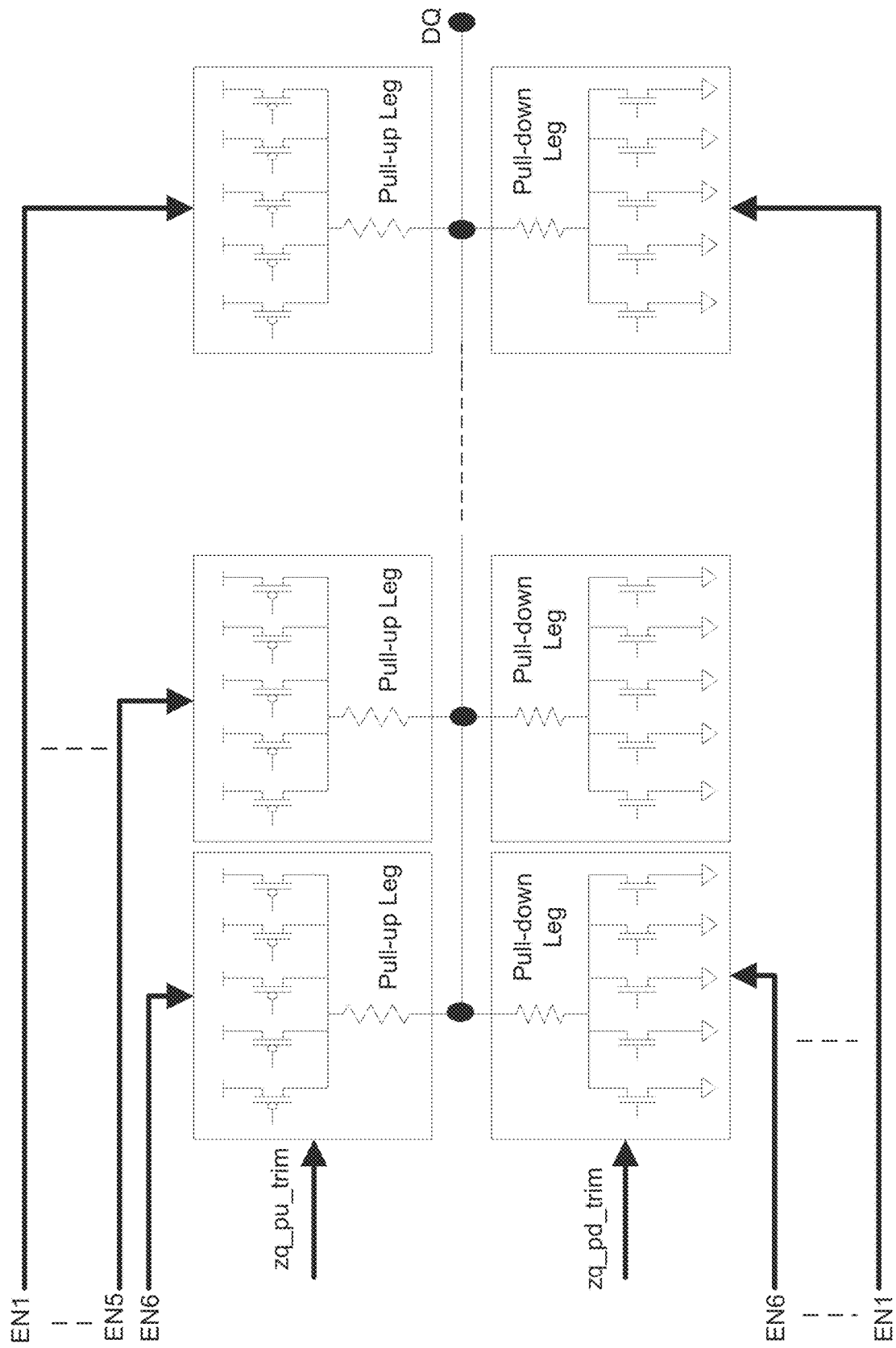
FIG. 5 depicts an example ZQ calibration circuit and a DQ output driver.

FIG. 5 depicts an example ZQ calibration circuit and DQ output driver. A connector or output node is labeled DQ. In this example, in a DQ output buffer, there are 6 enable signals to enable up to 6 legs at the same time. The enable signals control that the output resistance ($R_{on}$) the output buffer will exhibit. For example, each pull-up leg and each pull-down leg has a calibrated resistance of 300Ω after application of respective codes zq_trim_pu and zq_trim_pd from calibration to each instance of the six instances of pull-up legs and pull-down legs to set the transistors that are enabled and corresponding impedance or resistance contribution. Adjusting the output resistance is based on the enable signal EN1-EN6 to both pull-up legs and pull-down legs.

For example, Table 1 provides an example output resistance for values of EN1 . . . EN6. Other number of pull-up or pull-down legs can be used.

TABLE 1

| Enable | $R_{on}$ |
|---|---|
| 00001 | 300Ω |
| 00011 | 150Ω (300Ω/2) |
| 000111 | 100Ω (300Ω/3) |
| 001111 | 75Ω (300Ω/4) |
| 011111 | 60Ω (300Ω/5) |
| 111111 | 50Ω (300Ω/6) |

Figure 6:
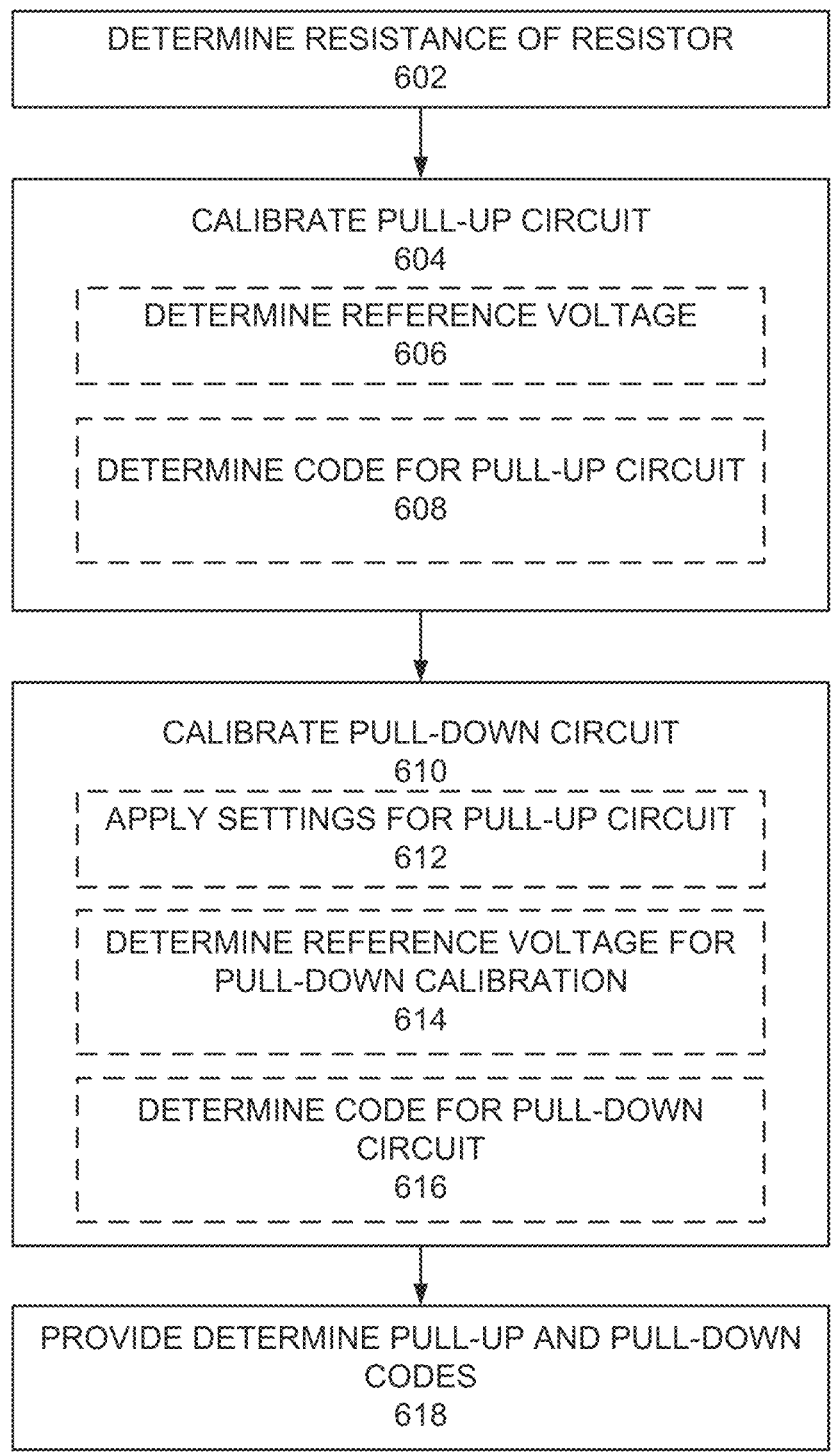
FIG. 6 provides a flow diagram of a process that can be used to calibrate an output resistance of a DQ output driver.

FIG. 6 provides a flow diagram of a process 600 that can be used to calibrate an output resistance of a DQ output driver. Process 600 can be performed in a factory for device calibration or outside of the factory when the device is with a customer or in-use, although uses are not restricted according to these examples. At 602, a determination of a resistance of an internal resistor used for ZQ calibration is performed. The resistance can be measured in a variety of manners such as by taking an average resistance of a chain of resistors to determine a resistance of the internal resistor. At 604, a calibration of a pull-up circuit can be performed. Calibration of the pull-up circuit can include using a voltage comparator where an input to the comparator is a reference voltage and a second input to the comparator is a voltage provided by the pull-up circuit in combination with the internal resistor. At 606, a reference voltage can be determined so that an effective output resistance of the pull-up circuit is a desired value. For example, if a measured resistance of the internal resistor (R) is 290Ω but the desired pull-up circuit resistance is 300Ω, then the reference voltage ($ZQ_{refq}$) can be set to provide a desired output resistance of the pull-up circuit $(R_{on})_{pu}$ according to:

$$(R_{on})_{pu} = \frac{Vccq - ZQrefq}{ZQrefq} \cdot R$$

In this example, the reference voltage can be 0.492*$V_{ccq}$. The determined reference voltage can be made available using a voltage calibration code that tunes an available voltage provided from a bias voltage $V_{ccq}$.

At 608, a determination of a code for the pull-up circuit can be made. The code can be set to control a number of transistors that are active in the pull-up circuit. The number of active transistors can be used to reduce or set an output resistance of the pull-up circuit. For example, if a code is 00001, then one transistor is active or if code is 11111, then all transistors are active. The code can otherwise be used to set an impedance or resistance of the pull-up circuit regardless of its internal structure. The code can be set to cause an output voltage from the pull-up circuit to match or approximately match the determined reference voltage.

At 610, calibration of a pull-down circuit can take place. At 612, a pull-up circuit with applied determined codes can be connected to the pull-down circuit. At 614, a reference voltage can be determined for the pull-down calibration. The reference voltage can be set so that an output resistance of pull-down circuit matches that of the pull-up circuit according to the following relationship:

$$(R_{on})_{pd} = \frac{ZQref}{Vccq - ZQrefq} \cdot (R_{on})_{pu}$$

Accordingly, the reference voltage is set to ½ $V_{ccq}$ (in other words, half the bias voltage).

At 616, a comparison is made of a voltage supplied by the pull-up circuit connected with a pull-down circuit against the reference voltage for the pull-down calibration. A code for the pull-down circuit can be determined based on the voltage supplied by the pull-up circuit connected with a pull-down circuit being the same or nearly the same as the reference voltage for the pull-down calibration.

At 618, pull-up and pull-down codes are provided for use by a device's output driver during data output or input. For example, a DQ pin can provide an output data signal or other signal or the DQ pin can receive data or other signal. Pull-up and pull-down codes can be used to control impedance or resistance of any or all instances of respective pull-up and pull-down circuits in or connected to the output driver. The DQ pin can be connected to system bus and to a NAND storage device (or other memory device). The DQ pin can be used to transfer data to a NAND or to a system bus from the NAND storage device (or other memory device).

Figure 7:
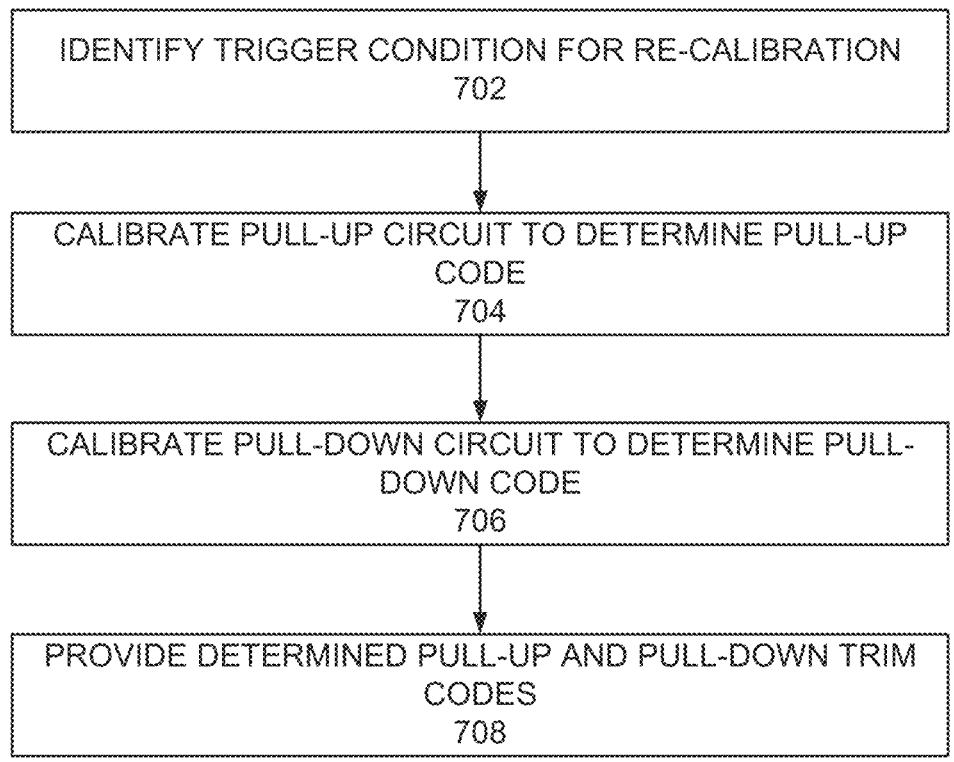
FIG. 7 provides an example process that can be used during calibration of pull-up or pull-down circuits by a device.

FIG. 7 provides an example process that can be used during calibration of pull-up or pull-down circuits by a device. At 702, a determination can be made to initiate a re-calibration operation. The device can initiate a calibration based on sufficient changes in temperature or bias voltage levels, if errors in output data are too large, at the request of a user or system, or any other reasons. For example, a sufficient change in temperature can be a change of 1.2 degrees C./second. For example, a sufficient change in bias voltage can be a change of 10 mV/second.

At 704, a calibration of a pull-up circuit can occur. The pull-up circuit calibration can use a stored reference voltage determined in an earlier calibration step. For example, a reference voltage calibration value ($K_1$) can be stored or corresponding tuning input that selects a reference voltage can be stored and used for the re-calibration. A pull-up code can be determined at 704 in a manner similar to 608 (FIG. 6) and made available for use. At 706, a pull-down calibration can occur. The pull-up circuit can be connected to the pull-down circuit and the pull-up code determined at 704 can be used. A reference voltage calibration value ($K_1$) determined in an earlier calibration for the pull-down circuit can be applied to provide the reference voltage set relative to the internal resistor. A pull-down code can be determined in a manner similar to 616 (FIG. 6) and made available for use. At 708, codes determined for pull-up and pull-down circuits can be stored and used to set an output impedance or resistance of an output driver.

Figure 8:
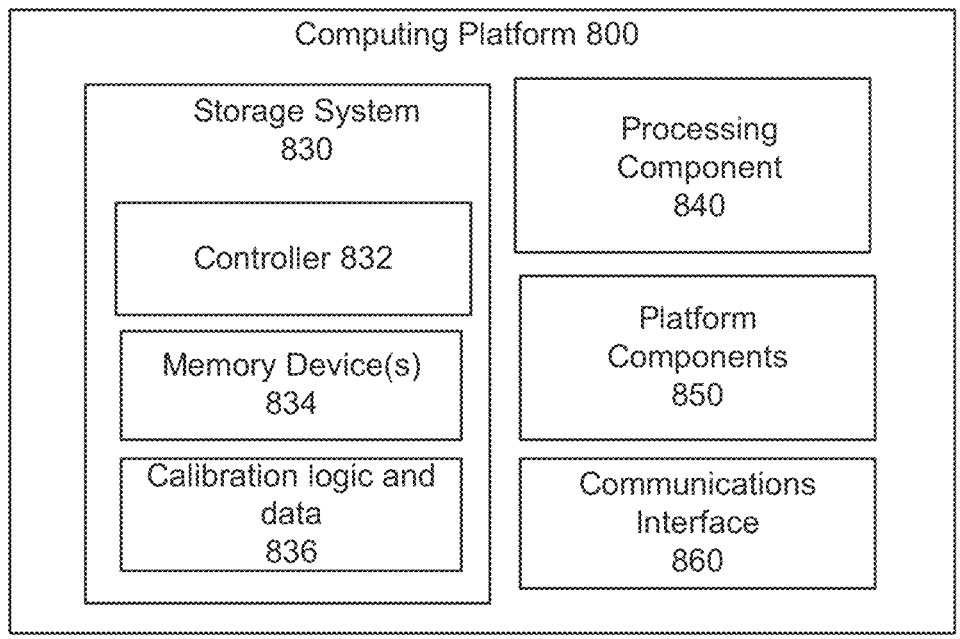
FIG. 8 illustrates an example computing platform.

FIG. 8 illustrates an example computing platform 800. In some examples, as shown in FIG. 8, computing platform 800 may include one or more of: a storage system 830, a processing component 840, platform components 850, or a communications interface 860. Computing platform 800 can be powered by any or a combination of: wall outlet power, solar power, battery power, or motion-generated power.

According to some examples, storage system 830 includes a controller 832 and memory devices(s) 834. For these examples, logic and/or features resident at or located at controller 832 may execute at least some processing operations or logic for any other activities described herein and may include storage media. Memory device(s) 834 may include similar types of volatile or non-volatile memory such as any type of storage device such as single-level cell (SLC) NAND storage device, multi-level cell (MLC) NAND storage device, triple level cell (TLC) NAND storage device, Quad Level Cell (QLC) NAND storage device or non-volatile storage devices including 2, 4, 8, 16 levels of information, or other number of levels of information, and so forth. Other examples of memory device(s) 834 may include memory devices that use chalcogenide phase change material (e.g., chalcogenide glass), NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Other examples of memory device(s) 834 may include, but are not limited to, random-access memory (RAM), Dynamic RAM (DRAM), double data rate synchronous dynamic RAM (DDR SDRAM), static random-access memory (SRAM), thyristor RAM (T-RAM) or zero-capacitor RAM (Z-RAM). Any of memory device(s) 834 can use structures and techniques described herein to tune an output impedance of an output driver.

Calibration logic and data 836 can include any circuitry or other logic used to calibrate or re-calibrate an output pull-up driver or pull-down driver as described herein. For example, calibration codes for pull-up and pull-down circuits, a reference voltage calibration value for pull-up circuit, and a reference voltage calibration value for a pull-down circuit can be stored.

According to some examples, processing component 840 may include various hardware elements, software elements, or a combination of both. In some examples, platform components 850 may include common computing elements, such as one or more processors, single or multi-cores, co-processors, memory units, chipsets, controllers, peripherals, interfaces, oscillators, timing devices, video cards, audio cards, multimedia I/O components (e.g., digital displays), power supplies, and so forth. Examples of memory units associated with either platform components 850 or storage system 830 may include without limitation, various types of computer readable and machine-readable storage media.

In some examples, communications interface 860 may include logic and/or features to support a communication interface. For these examples, communications interface 860 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification.

Communications interface 860 can include radio frequency (RF) transceiver components for accessing wireless voice and/or data networks (e.g., using cellular telephone technology, data network technology such as 3G, 4G/LTE, Wi Fi, other IEEE 802.11 family standards, or other mobile communication technologies, or any combination thereof), components for short range wireless communication (e.g., using Bluetooth and/or Bluetooth LE standards, NFC, etc.), and/or other components. In some embodiments, communications interface 860 can provide wired network connectivity (e.g., Ethernet) in addition to or instead of a wireless interface. Communications interface 860 can be implemented using a combination of hardware (e.g., driver circuits, antennas, modulators/demodulators, encoders/decoders, and other analog and/or digital signal processing circuits) and software components. In some embodiments, communications interface 860 can support multiple communication channels concurrently or at different times, using the same transport or different transports.

Computing platform 800 may be part of a computing device that may be, for example, user equipment, a computer, a personal computer (PC), a desktop computer, a laptop computer, a notebook computer, a netbook computer, a tablet, a smart phone, virtual reality or augment reality device, autonomous driving or flying vehicle, Internet-of-things (IoT) device, embedded electronics, a gaming console, a server, a server array or server farm, a web server, a network server, a proxy device, a work station, a minicomputer, a main frame computer, a supercomputer, a network appliance, a web appliance, a distributed computing system, multiprocessor systems, processor-based systems, or combination thereof. Accordingly, functions and/or specific configurations of computing platform 800 described herein, may be included or omitted in various embodiments of computing platform 800, as suitably desired.

The components and features of computing platform 800 may be implemented using any combination of discrete circuitry, ASICs, field programmable gate arrays (FPGAs), logic gates and/or single chip architectures. Further, the features of computing platform 800 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

The appearances of the phrase "one example" or "an example" are not necessarily all referring to the same example or embodiment. Any aspect described herein can be combined with any other aspect or similar aspect described herein, regardless of whether the aspects are described with respect to the same figure or element.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed is:

1. A method comprising:
   determining a reference resistance level of a calibration resistor;
   determining a reference voltage to apply during calibration of a pull-up circuit to cause an output resistance of the pull-up circuit to be a value R1;
   determining a first code associated with the pull-up circuit, wherein the first code controls a resistance of the pull-up circuit;
   determining a second reference voltage to apply during calibration of a pull-down circuit to cause an output resistance of the pull-down circuit to be a value R2; and
   determining a second code associated with the pull-down circuit, wherein the second code controls a resistance of the pull-down circuit.

2. The method of claim 1, wherein the determining a reference voltage to apply during calibration of a pull-up circuit to cause an output resistance of the pull-up circuit to be a value R1 comprises:
   determining a fraction of a bias voltage to apply during calibration of the pull-up circuit to cause an output resistance of the pull-up circuit to be a value R1.

3. The method of claim 1, wherein determining a first code associated with the pull-up circuit comprises:
   comparing a voltage from the pull-up circuit with the determined reference voltage and
   determining the first code so that the reference voltage is approximately the same as the voltage from the pull-up circuit.

4. The method of claim 1, wherein determining a second reference voltage to apply during calibration of a pull-down circuit to cause an output resistance of the pull-down circuit to be a value R2 comprises:
   determining a second reference voltage so that the value R2 approximately matches R1.

5. The method of claim 1, wherein determining a second code associated with the pull-down circuit comprises:
   coupling the pull-up circuit to the pull-down circuit, wherein the pull-up circuit uses the first code;
   comparing a voltage from the pull-down circuit with the determined second reference voltage; and
   determining a second code so that the second reference voltage is approximately the same as the voltage from the coupling of the pull-up circuit and the pull-down circuit.

6. The method of claim 1, comprising:
   during operation of an output driver:
      applying the first code to one or more pull-up circuits and
      applying the second code to one or more pull-down circuits.

7. The method of claim 1, comprising:
   initiating a re-calibration of one or more of: the pull-up circuit and the pull-down circuit;
   storing a third code to set a resistance of the pull-up circuit and determined in re-calibration of the pull-up circuit; and
   storing a fourth code to set a resistance of the pull-down circuit and determined in re-calibration of the pull-down circuit.

8. An apparatus comprising:
   a semiconductor device comprising a connector, the connector to provide an output impedance based on communicatively coupling with another circuit,
   at least one pull-up circuit coupled to the connector;
   at least one pull-down circuit coupled to the connector; and
   a memory to store a first reference voltage calibration value, a second reference voltage calibration value, a first code, and a second code, wherein:
      the at least one pull-up circuit comprises one or more of: a transistor or a resistor,
      the first code is to set a resistance level of the at least one pull-up circuit,
      the at least one pull-down circuit comprises one or more of: a transistor or a resistor,
      the second code is to set a resistance level of the at least one pull-down circuit,
      the first reference voltage calibration value used to calibrate a first pull-up circuit,
      the second reference voltage calibration value used to calibrate a first pull-down circuit, and
      the first reference voltage calibration value is the same or different than the second reference voltage calibration value.

9. The apparatus of claim 8, wherein the semiconductor device comprises a memory device, wherein the connector is to provide data signals to or from the memory device.

10. The apparatus of claim 8, wherein the semiconductor device comprises one or more of: a non-volatile memory device or a volatile memory device.

11. The apparatus of claim 8, comprising:
    logic to enable one or more of the at least one pull-up circuit and one or more of the at least one pull-down circuit to control an output impedance of the connector.

12. The apparatus of claim 8, further comprising:
    a calibration controller coupled to the at least one pull-up circuit and the at least one pull-down circuit, the calibration controller comprising logic to calibrate or re-calibrate the at least one pull-up circuit and the at least one pull-down circuit.

13. The apparatus of claim 12, wherein to re-calibrate the at least one pull-up circuit and the at least one pull-down circuit, the calibration controller is to:
    set a reference voltage value based on the first reference voltage calibration value,
    determine a third code to adjust a resistance of a first pull-up circuit so that a voltage provided by the first pull-up circuit approximately matches the reference voltage,
    set a second reference voltage value based on the second reference voltage calibration value, and
    determine a fourth code to adjust a resistance of a first pull-down circuit so that a voltage provided by the first pull-down circuit coupled with the first pull-up circuit approximately matches the second reference voltage.

14. The apparatus of claim 13, wherein
    the calibration controller is to store the third code and the fourth code into the memory,
    the third code is to set a resistance level of the at least one pull-up circuit, and
    the fourth code to set a resistance level of the at least one pull-down circuit.

15. The apparatus of claim 13, further comprising:
    a serial resistor chain to receive a bias voltage and
    a selector to receive voltages provided by the serial resistor chain and to output the first reference voltage based on the first reference voltage calibration value or output the second reference voltage value based on the second reference voltage calibration value.

16. A system comprising:
    at least one processor;

at least one memory device communicatively coupled to the at least one processor;

an output driver communicatively coupled to the memory device, the output driver comprising a connector;

at least one pull-up circuit coupled to the connector;

at least one pull-down circuit coupled to the connector; and a memory to store a first reference voltage calibration value, a second reference voltage calibration value, a first code, and a second code, wherein:

the at least one pull-up circuit comprises one or more of: a transistor or a resistor, the first code is to set a resistance level of the at least one pull-up circuit, the at least one pull-down circuit comprises one or more of: a transistor or a resistor, the second code is to set a resistance level of the at least one pull-down circuit, the first reference voltage calibration value used to calibrate a first pull-up circuit, the second reference voltage calibration value used to calibrate a first pull-down circuit, and the first reference voltage calibration value is the same or different than the second reference voltage calibration value.

17. The system of claim 16, wherein the at least one memory device comprises one or more of: a non-volatile or volatile memory device.

18. The system of claim 16, comprising:

logic to enable one or more of the at least one pull-up circuit and one or more of the at least one pull-down circuit to control an output impedance of the connector.

19. The system of claim 16, comprising:

a calibration controller coupled to the at least one pull-up circuit and the at least one pull-down circuit, the calibration controller comprising logic to calibrate or re-calibrate the at least one pull-up circuit and the at least one pull-down circuit.

20. The system of claim 19, wherein to re-calibrate the at least one pull-up circuit and the at least one pull-down circuit, the calibration controller is to:

set a reference voltage value based on the first reference voltage calibration value, determine a third code to adjust a resistance of a second pull-up circuit so that a voltage provided by the second pull-up circuit approximately matches the reference voltage, set a second reference voltage value based on the second reference voltage calibration value, and determine a fourth code to adjust a resistance of a second pull-down circuit so that a voltage provided by the second pull-down circuit in combination with the second pull-up circuit approximately matches the second reference voltage.

21. The system of claim 20, further comprising one or more of:

a wireless network interface communicatively coupled to the at least one processor;

a display communicatively coupled to the at least one processor; or a battery communicatively coupled to the at least one processor.

* * * * *